(12) United States Patent
Peter Koops et al.

(10) Patent No.: US 7,537,708 B2
(45) Date of Patent: *May 26, 2009

(54) PROCEDURE FOR ETCHING OF MATERIALS AT THE SURFACE WITH FOCUSSED ELECTRON BEAM INDUCED CHEMICAL REACTIONS AT SAID SURFACE

(75) Inventors: Hans Wilfried Peter Koops, Ober-Ramstadt (DE); Klaus Edinger, Ludwigshafen (DE)

(73) Assignee: Nawotec GmbH, Rossdorf (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/772,755

(22) Filed: Jul. 2, 2007

(65) Prior Publication Data

US 2008/0011718 A1    Jan. 17, 2008

Related U.S. Application Data

(63) Continuation of application No. 10/428,269, filed on May 2, 2003, now Pat. No. 7,238,294.

(30) Foreign Application Priority Data

May 16, 2002    (EP)    .................... 02010233

(51) Int. Cl.
*B44C 1/22*    (2006.01)
(52) U.S. Cl. ...................... 216/65; 216/66; 257/E21.25
(58) Field of Classification Search ........................ None
See application file for complete search history.

(56) References Cited

U.S. PATENT DOCUMENTS

| | | | |
|---|---|---|---|
| 4,226,666 A | 10/1980 | Winters | |
| 5,055,696 A | 10/1991 | Haraichi et al. | |
| 5,113,072 A | 5/1992 | Yamaguchi et al. | |
| 5,145,436 A | 9/1992 | Bol | |

(Continued)

FOREIGN PATENT DOCUMENTS

DE         4416597 A1    11/1995

(Continued)

OTHER PUBLICATIONS

Koops, High-Resolution Electron-Beam Induced Deposition, Journal of Vacuum Science: Part B, 1987, pp. 477-481, V 6, No. 1, American Institute of Physics, New York, US.

(Continued)

*Primary Examiner*—Allan Olsen
(74) *Attorney, Agent, or Firm*—Woodling, Krost, and Rust

(57) ABSTRACT

The invention refers to a procedure for etching of materials at the surface by focussed electron beam induced chemical reactions at said surface. The invention is characterized in that in a vacuum atmosphere the material which is to be etched is irradiated with at least one beam of molecules, at least one beam of photons and at least one beam of electrons, whereby the irradiated material and the molecules of the beam of molecules are excited in a way that a chemical reaction predetermined by said material and said molecules composition takes place and forms a reaction product and said reaction product is removed from the material surface-irradiation and removal step.

Figure 1:
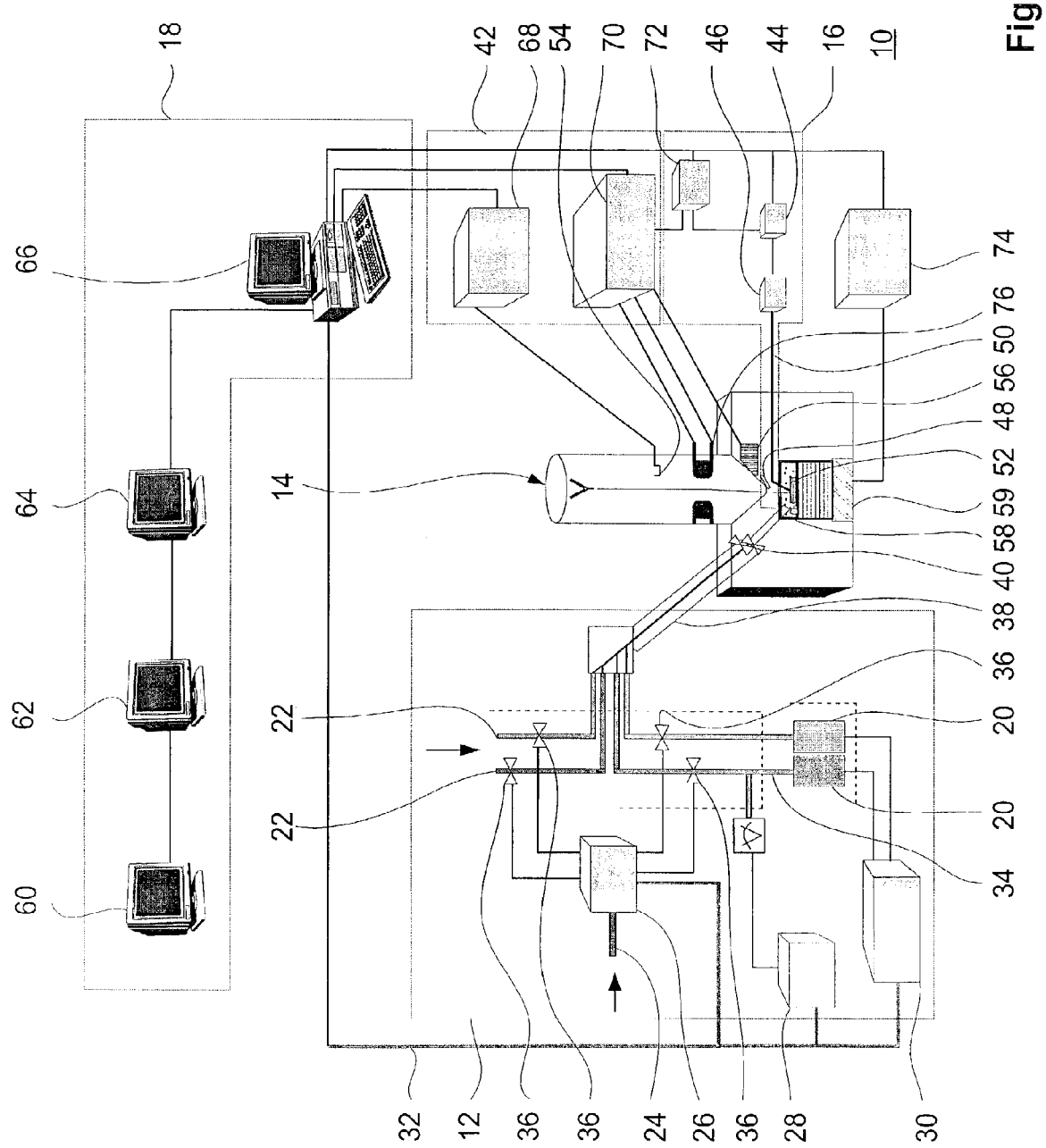

19 Claims, 2 Drawing Sheets step I step II

U.S. PATENT DOCUMENTS

| | | | |
|---|---|---|---|
| 5,229,320 A | 7/1993 | Ugajin | |
| 5,267,884 A | 12/1993 | Hosogi | |
| 5,683,547 A | 11/1997 | Azuma et al. | |
| 5,849,371 A | 12/1998 | Beesley | |
| 6,261,938 B1 | 7/2001 | Beauvais et al. | |
| 6,387,530 B1 | 5/2002 | Liu et al. | |
| 6,677,586 B1 | 1/2004 | Nasser-Ghodsi et al. | |
| 6,751,516 B1 | 6/2004 | Richardson | |
| 6,843,927 B2 | 1/2005 | Nasser-Ghodsi | |
| 6,921,722 B2 * | 7/2005 | Ogure et al. | 438/708 |
| 6,943,350 B2 | 9/2005 | Nasser-Ghodsi et al. | |
| 7,238,294 B2 * | 7/2007 | Koops et al. | 216/62 |
| 2001/0052577 A1 | 12/2001 | Aki et al. | |
| 2001/0055649 A1 | 12/2001 | Ogure et al. | |
| 2003/0000921 A1 | 1/2003 | Liang | |
| 2003/0066749 A1 | 4/2003 | Golovchenko et al. | |
| 2005/0072753 A1 | 4/2005 | Koops | |
| 2006/0192141 A1 | 8/2006 | Koops | |

FOREIGN PATENT DOCUMENTS

| | | |
|---|---|---|
| DE | 4435043 A1 | 4/1996 |
| DE | 19609234 A1 | 9/1997 |
| DE | 100 42 098 A | 3/2002 |
| EP | 02-01-0233 | 4/2003 |
| EP | 02023217 | 4/2003 |
| JP | 60167316 A | 8/1985 |
| JP | 60198827 A | 10/1985 |
| JP | 02183530 A | 7/1990 |
| JP | 02205682 A | 8/1990 |
| JP | 03054824 A | 3/1991 |
| JP | 08017704 A | 1/1996 |
| JP | 61234038 A | 10/1996 |
| JP | 62076521 A | 4/1997 |
| WO | WO 02 19375 A | 3/2002 |
| WO | PCTEP2004/00059 | 6/2005 |

OTHER PUBLICATIONS

Koops et al "Miniature low voltage beam systems producable by combined lithographies" Nuclear Instruments & Methods in Physics Research-A, 1995, pp. 1-9, Nr. 1, Bd. A363, XP004009614, ISSN:0168-9002, North-Holland Publishing Company. Amsterdam, NL.

Koops et al. "Construction of a three-dimensional microtriode by nanolithography with electron-beam induced deposition" Vacuum Microelectronics Conference, Jul. 7, 1996, pp. 458-462, XP010232233, ISBN: 0-7803-3594-5, IVMC'96., 9th International St. Petersburg, Russia Jul. 7-12, 1996, New York, NY, USA, IEEE, US.

Liang, Ted, Stivers, Alan, Damage-Free Mask Repair Using Electron Beam Induced Chemical Reactions, Intel Corporation Proc. SPIE vol. 4688. p. 375-384, Jul. 2002.

Haight et al., MARS: Femtosecond laser mask advanced repair system in manufacturing, J Vac. Sci. Technol. B17(6), Nov/Dec. 1999, 3137-3143, 17(6),American Vacuum Society.

Ehrlich et al., A Review of Laser-Microchemical Processing, J. Vac. Sci. Technol. B, Oct.Dec. 1983, 969-984, vol. 1, No. 4, American Vacuum Society.

IBM, Technical Disclosure Bulletin, vol. 36, No. 05, May 1993, Repair System for Mask, IBM Corp., Armonk, NY, US.

* cited by examiner

PROCEDURE FOR ETCHING OF MATERIALS AT THE SURFACE WITH FOCUSSED ELECTRON BEAM INDUCED CHEMICAL REACTIONS AT SAID SURFACE

This application is a continuation of Ser. No. 10/428,269 filed May 2, 2003 now U.S. Pat. No. 7,238,294 and claims priority thereto. Application Ser. No. 10/428,269 claims priority to EP Patent No. 02010233.1 filed May 16, 2002.

The invention relates to a procedure for etching of materials at the surface with focussed electron beam induced chemical reactions at said surface according to the features of the introductory part of claim 1. In general the invention relates to focussed electron beam induced chemical reactions and their application to material processing. In particular it relates to the removal of material with high spatial resolution using electron beam induced etching. It also relates to the repair of photo masks and the modification of integrated circuits and other devices on a nanometer scale.

A number of direct writing technologies, most of them based on focussed particle or photon beams, have been developed that they allow the modification of materials on a nanometer scale. Examples where those technologies are applied in the semiconductor industry include the repair of photo masks and the modification of integrated circuits. In most of these applications it is required that the technology can remove as well as add material with sub-micrometer precision. For material addition it might be necessary to deposit several materials having specific chemical and physical properties.

For material removal it might be required to remove one material selectively from a combination of materials without creating damage in the remaining material. Other requirements might include the obtainable positioning accuracy and the minimum feature size, e.g. resolution, of the process. Some of those requirements will be illustrated in the following for photolithographic mask repair, which is one preferred application of the present invention.

For this purposes photon beam ablation, photon beam induced chemical etching, ion beam sputtering and ion beam assisted chemical etching are or could potentially be used to etch materials used for photo masks in the semiconductor fabrication process.

Photolithographic masks usually consist of a light transparent substrate, e.g. glass, quartz, which carries a structured chromium metal layer of 100 nm thickness. On the masks certain areas are patterned using a light absorbing material—absorber—, such as chromium, to block light transmission in these areas. These masks are used in the semiconductor industry to project a pattern located on the mask onto a wafer, which is covered with a light sensitive substance, e.g. photoresist. These masks can have at least two kinds of defects, which need to be repaired.

1) Absorber material is missing, where there should be absorber—clear defect—and 2) absorber material in areas where there should be no absorber—opaque defect.

Currently, common mask repair tools are based on a laser beam or a focussed ion beam—FIB. Chemical and/or physical processes that are or could be employed by these tools are photon beam ablation, photon beam induced chemical etching, ion beam sputtering and ion beam assisted chemical reactions, deposition and etching.

It is state of the art to remove absorber material such as chrome by a focussed laser beam. Usually, high energy, short pulse laser beams are used. Interaction between the laser beam and the material can be for example photothermal or photochemical. For mask repair laser ablation is used, where the material is evaporated by locally heating it with the laser beam. Laser induced chemical reactions could potentially also be used for mask repair, where the laser beam provides the energy to cause a reaction between the material and a suitable gas such as chlorine, resulting in volatile products that desorbs. In this context it is referred to the article "MARS: Femtosecond laser mask advanced repair system in manufacturing" of R. Haight, D. Hayden, P. Longo, T. Neary and A. Wagner in Japanese Vacuum Science Technology, 17(6), Nov./Dec. 1999, pages 3137 to 3143 and to the Article "A review of laser-microchemical processing" of D. J. Ehrlich and J.Y. Tsao, J. Vac. Sci. Technol. B 1 (4), Oct-Dec 1983.

However, all photon beam based processing suffers from a limited resolution due to the Abbé diffraction resolution criterion, which tells that the obtainable resolution is ca. 0.5 times the wavelength of the light in use.

Ion beam sputtering is an effective process with potentially 10 nm resolution, but generates damage in the substrate which is not tolerable for several applications. Ion beam assisted chemical etching is also an effective process with somewhat lower resolution, approximately 100 nm, but also generates damage in the substrate which is not tolerable for several applications. Both processes are applied for etching of opaque defects in photo mask repair.

With the increasing resolution requirements of photo masks for the chip production in the next generations, and with the additional technical modification of the mask pattern to obtain the required resolution such as optical proximity effect structures or phase shift masks, and EUV-multilayer masks, the semiconductor industry is today in the situation that the approved methods of laser ablation and deposition, as well as the ion beam sputtering, and chemically assisted ion beam etching and deposition is no longer tolerable because of lack of resolution and lack of transmission of the substrate after the repair. Therefore, a nondestructive soft and clean chemical etching method needs to be applied for opaque defects in photomasks and "next generation masks" such as EUV masks, which does not implant metal ions into the substrate and does not mix the underlying material causing structural damage introduced by the ion impact.

Currently, focussed electron beams are only used to repair clear defects by locally adding absorber material. This is done by exposing a selected local area with an electron beam, while simultaneously delivering a flow of precursor gas to the area. The electron beam then decomposes the precursor gas, e.g. hydrocarbons, inorganic, or organometallic molecules, leaving behind a deposit in the area that was scanned by the electron beam. Removal of material is more difficult because electrons do not deliver enough momentum to eject, e.g. sputter, substrate atoms, like a focussed ion beam can. At present, electron beam etching has only been demonstrated for a few material systems, where activated by the focussed electron beam, a chemical reaction is induced, which results in volatile products and, thus, a removal of material.

Although there is only very little research on electron beam induced etching reactions, the reaction will certainly be a complex sequence of single elementary reactions, which will involve several steps such as adsorption of precursor gas molecules—physisorption and/or chemisorption—, diffusion of precursor molecules or their fragments into the substrate, one or more reactions between these precursor molecules and the substrate atoms and finally the desorption of the reaction product. In order to confine the etching process to an area that has been exposed with a focussed electron beam and thus provides the high spatial resolution of the process, it is required that the etching process does not occur spontaneously and at least one step in the reaction sequence has to be induced by electron beam exposure. An example for electron beam induced etching is the removal of silicon dioxide —$SiO_2$— with $XeF_2$ where etching only takes places in areas that have been simultaneously exposed to a beam of electrons and $XeF_2$ molecules. See for example: Ted Liang, A. Stivers, G. Liu, G. Dao, V. Liberman, M. Rothschild, S. T. Palmacci and L. Scipioni, "Damage-free Mask Repair Using Electron Beam Induced Chemical Reactions", 2nd Int'l. Symp.on 157 nm Lithography, Dana Point, Calif. (May 2001).

The very high resolution and precision of material etching in the photo mask repair and circuit editing procedures of the semiconductor industry in its novel circuits and masks with structures below the wavelength of the ultra violet light requires a novel technology to be employed for the repair of such structures.

Therefore, it is an object of the present invention to improve the procedure for etching of materials at the surface with focussed electron beam induced chemical reactions at said surface so as to overcome the cited drawbacks and to propose a procedure for locally removing material with higher spatial resolution.

It is especially an object of the invention to etch multilayer structures without mixing of the layers of the metals and insulators which can have thicknesses in the range of several tens of nanometers.

This object is achieved by the characterizing features as defined in claim 1 in conjunction with the features in its introductory part.

The understanding underlying the invention is that a combination of a focussed beam of electrons, a beam of molecules and a beam of photons provides the high spatial resolution and the required activation energy for a chemical reaction, forming a reaction product which can be removed. Hereby said reaction only takes place in areas that have been exposed and chemically or physically modified by said beam of electrons.

According to the invention the procedure comprises the following steps:

in a vacuum atmosphere the material which is to be etched is irradiated by at least one beam of molecules, at least one beam of photons and at least one beam of electrons, whereby the irradiated material and the molecules of the beam of molecules are excited in a way that a chemical reaction predetermined by said material and said molecules composition takes place and forms a reaction product and said reaction product is removed from the material surface—irradiation and removal step.

Especially, the chemical reaction sequence between the material to be etched and the gas of the beam of molecules contains at least one elemental chemical or physical reaction which is induced selectively by electron beam exposure. In addition, at least one elemental chemical or physical reaction in the reaction sequence, is induced or enhanced by said beam of photons with a well specified energy and duration to induce said chemical reaction and gettering said reaction product in said irradiation and removal step.

On the one hand, the energy delivered by said beam of photons could be photo thermal, especially to raise the surface temperature of the material to be etched locally and temporarily by a defined amount as control by the laser intensity and wavelength.

On the other hand, the energy delivered by said beam of photons could cause a photo chemical reaction, especially whereby the wavelength of the laser light is tuned to a wavelength to cause resonant electronic excitation in the material or within an intermediate chemical species generated by previous electron beam exposure.

Especially, said elemental reaction induced by the photon beam could be the evaporation of the reaction products from the surface by said pulsed and focussed beam of photons, which heats the material locally to a temperature above the vaporization temperature of the reaction product.

Said beam of photons is delivered by a continuous laser source such as a semiconductor diode laser with a wavelength from IR to visible—2000 nm to 250 nm—or by a pulsed laser system such as an eximer laser or a ion laser with a wavelength from 2000 nm to 157 nm.

Especially, in the irradiation and removal step the beam of electrons is delivered with a scanning focussed electron beam system with a spot size of 0.1 to 1000 nm to generate a dense distribution of adsorptions sites for the reaction partner molecules from the beam of molecules.

Said beam of molecules consisting of one or more gases could be issued from a gas feeding system in a stoichiometric composition to the materials surface during said irradiation and removal step.

According to one embodiment of the invention initially the surface of the material to be etched is cleaned—cleaning step.

Advantageously, the cleaning step is realized by a chemical reaction to remove contamination, oxides or other material covering the surface. On the one hand, in the case that the material covering the surface layer is formed by carbon contamination the chemical reaction forming a further reaction product is initiated by an additional beam of molecules comprising water, hydrogenperoxyde, chlorine or other halogen compounds which release excited oxygen and/or halogen atoms to react with the carbon of the surface layer.

Additionally or alternatively, the cleaning step is realized by heating and subsequent evaporation of the surface of the area to be cleaned with a focussed beam of photons of sufficient energy density to heat the surface to a temperature above the vaporization temperature of the further reaction product.

According to one embodiment of the invention, the beam of molecules comprises different precursor gases.

Advantageously, the gas feeding system is formed by a multi jet system with a flow rate from 0,1 to 10000 monolayers/sec.

For instance, at least one of the precursor gases delivered by the multi-jet gas delivery system, consists of molecules, which are not reactive spontaneously or when exposed to a beam of photons, but can be activated by electron beam exposure.

Furthermore, the precursor gases could contain halogens, which release said halogen when exposed to said beam of electrons in a process known as dissociative electron attachment.

According to one embodiment of the invention, said beam of molecules, said beam of photons and said beam of electrons are either delivered simultaneously or delivered subsequently, in a synchronized and timely controlled fashion with defined delivery times and delays between the various exposures.

In the case that said beams are delivered subsequently, the cycle of exposures is repeated until a desired etch depth has been reached. The repetition loop time can be controlled by exposing adjacent or other pixels in a timely sequence as required to generate a defined time lag before the start of the next exposure sequence, or by turning the electron beam off, e.g. beam blanking, for a defined period of time.

In this connection there are the following possibilities:

On the one hand, a defined dose of said beam of molecules beam "A" is delivered first, followed by an exposure of said beam of electrons, followed by a defined dose of said beam of molecules "B".

On the other hand, a defined dose of a said beam of molecules "A" is delivered first, followed by a pulse of said beam of photons of defined duration, intensity and wavelength, followed by a defined dose of said beam of molecules "B".

According to one embodiment of the invention, the material to be etched could be chromium. Then the beam of molecules contains halogens such as $XeF_2$, $Cl_2$, $Br_2$ or $I_2$—halogen beam. Furthermore, the beam of molecules could contain oxygen such as $O_2$, $H_2O$ or $H_2O_2$—oxygen beam—and is used in addition to said halogen beam. The halogen and oxygen containing beams are delivered simultaneously. Or, if they are delivered subsequently, said beam of molecules "A" is a halogen beam and said beam of molecules "B" is an oxygen beam or said beam of molecules "A" is an oxygen beam and said beam of molecules "B" is a halogen beam.

In summary, the present invention describes a method to remove material with high spatial resolution using a focussed electron beam to define the area to be removed. The material is removed by a reaction between the substrate material and a suitable precursor gas such as halogens. The reaction results in volatile compound that desorbs from the surface. A combination of focussed electron beam and a laser beam is used to initiate a reaction sequence starting with the adsorption of precursor molecules and ending with the desorption of the reaction products. Within the reaction sequence the electron beam induces one or more reaction steps and provides the spatial resolution of the process. The laser beam delivers the required activation energy for one or more reaction steps that cannot be activated by the electron beam alone. However, the laser beam induced reaction takes place only in areas that have been exposed and "activated" or altered by the electron beam.

Figure 2:
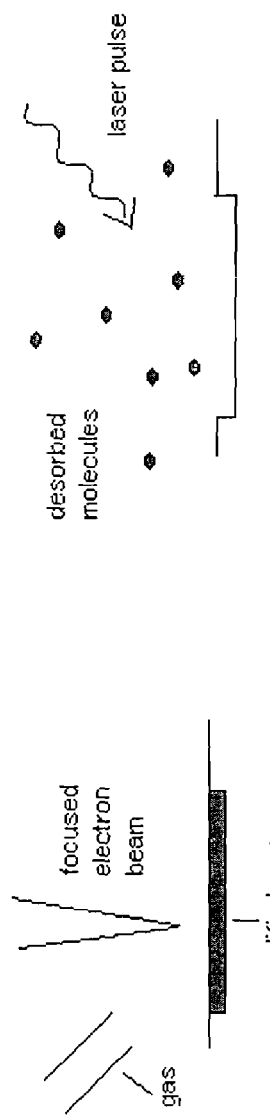
Figure 3:
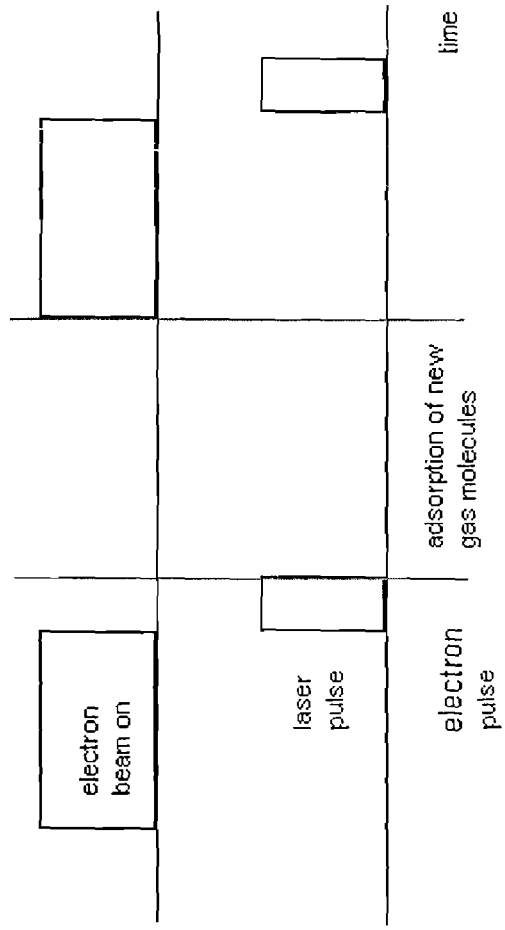

Further advantages and features of the invention will become apparent from the following description of an embodiment with reference to the attached drawing in which FIG. 1 is a schematic view of a mask repairs system according to the invention;

FIG. 2 is a schematic view of the main step of the procedure, namely irradiation and removal step, and FIG. 3 is a schematic view of subsequent beams of electrons, photons and molecules according to the invention.

FIG. 1 shows a schematic set up of a mask repair system 10 having a known molecular beam delivery system, referred to in the following as gas supply system 12, a known electron beam system 14, a known photon beam system, referred to in the following as laser beam system 16, and a computer control system 18 for timely triggered action and cooperation of these beams—beam of molecules, beam of photons and beam of electrons—for the procedure according to the invention.

The gas supply system 12 comprises a reservoir 20 for liquid or solid precursors—Peltier cooled—, feedings 22 of gaseous precursors, a feeding of pressurized air 24, a valve control 26, a pressure gauge 28 and a temperature control 30 for the reservoirs 20. The valve control 26, the pressure gauge 28 and the temperature gauge are connected for controlling via a CAN open bus 32 to the computer control system 18.

The reservoirs 20 are connected via feedings 34 having nozzles 36 to a nozzle-manifold 38. Also, the feedings 22 having nozzles 36 are connected to the nozzle manifold 38. The nozzle-manifold 38 has end valves 40 at each nozzle. Nozzles 36 are connected with the valve control 26 for operating the valves in the feedings 22 and 34 with pressurized air.

The electron beam system 14 comprises an electron beam control unit 42.

The laser beam system 16 comprises a laser power supply 44 and a laser unit 46 and a trigger unit 72. The laser unit works together with a mirror 48 to deflect the laser beam 50 on the mask 52 to be repaired. Alternatively, the laser beam can be focussed and directed onto the mask by using a optical fibre system connected to a focussing lens system inside the vacuum chamber, not shown.

The electron beam control unit 42 comprises a Faradays cage 54 for current measurement and a secondary electron detector 56 and corresponding control units 68 and 70, as well as beam deflection coils 76 and a beam blanker.

An environmental chamber 58 is provided wherein the procedure according to the invention described below takes place. This can also be achieved (resembled) by using an electron beam system, which enables to operate the sample chamber at high pressure using a variable pressure or environmental vacuum pressure control system, as supplied by instrument builders. Those systems also allow to rise the pressure in the sample chamber up to 15 torr without disabling the operation of the electron beam. The gas supply system 12, the electron beam system 14 and the laser beam system 16 act in the environmental chamber 58. An interferometer controlled motorized stage 59 is provided to position the mask 52.

The computer control system 18 comprises four windows for the control of the mask repair system 10, namely a multijet window 60, an electron beam window 62, a repair control window 64 and a microscope window 66. Furthermore, a beam control computer 68 is provided to control the electron beam unit 42. Therefore, the electron beam computer unit 60 is connected with the Faradays cage for current measurement and a beam control 70 is connected with the electron beam unit 42 in the known art.

For the time dependent control a trigger 72 is provided which is connected with the beam control 70 and the laser power supply 44.

Furthermore, a laser interferometer stage control unit 74 is connected with the stage 59 and the computer control system 18.

The procedure with the mask repair system 10 is now described:

The electron beam of a high resolution scanning beam system is used, which employs the brightest and in long terms stable electron source, the thermal field emission cathode. Well developed electron optical systems allow to focus the electron beam to 2 nm spot diameters having energies from 100 eV up to 40 keV or even 200 kev The distribution of the electrons in the crossover of the beam is very sharp defined, due to the low lens aberrations and the low energy width of the electron source and the specialized beam path, which in some cases has no crossover (where the energy width of the beam broadens by Coulomb interaction of the electrons). In principle electron beam systems achieve a better performance, in terms of resolution and power density, than ion beam or photon beam systems by almost an order of magnitude each.

Electron beams surpass the ion beams in power density by orders of magnitude, however, due to the low momentum transfer of electrons to the atoms of the workpiece, a much higher number of electrons is required than ions for the same action. Typically 50 to 250 times more electrons are required in comparison to ions. This results also from the much higher scattering cross sections of the slow ions, which are 48 times the square root of the mass number of the ion slower than the electrons, and therefore interact better with the atoms. In addition the Coulomb interaction for knock on processes is stronger by the factor of the nuclear charge of the ions. The ion impact however, generates a cascade of focussed knock on processes, which transfer the momentum of the ion into the depth of the sample, where it damages the material. The ion itself is implanted in a shallow region close to the surface of the sample and acts as an impurity and absorbs deep UV photons, especially at 157 nm.

A clean and nondestructive method is to use absorption of chemicals, to activate the absorbed chemicals to react with the substrate metal to form a solid, liquid or gaseous compound, and in the case of a liquid or solid reaction product to drive these molecules off the surface with a fine focussed high power laser pulse, which thermally heats the surface to a temperature above the sublimation or evaporation temperature of the chemical compound.

The procedure according to the invention employs the gas supply system 12 with high gas flux switching capability as described in DE 100 42 098 A1 and WO 02/19575 A1. These documents are part of the disclosure of this application in connection with the invention. This allows the deposition of single monolayers of precursors at the workpiece surface. A scanning electron beam system like a scanning electron microscope or a lithography system is required to pattern the surface of the workpiece with a well defined dwell time and current density.

The process of additive nanolithography is well described in the article: H. W. P. Koops, J. Kretz, M. Rodolph, M. Weber, G. Dahm, and K. Lee, "Characterization and application of materials grown by electron beam induced deposition", Jpn. J. Appl. Phys Vol. 33 (1994) 7099-7107. This article is part of the disclosure of this application in connection with the invention.

The beam of electrons might cause a potentially reactive molecule, for example halogens, to chemisorbs onto the target material or it might change the chemical composition in some other way under electron beam induced activation, while no chemisorption or alterations in composition occur in areas that are not exposed to the electron beam.

In any case the effect of the local electron beam exposure will be that the exposed area is in some chemically activated state, that when selectively induced by a laser beam, by for example photo-thermal or photo-chemical activation, those areas will further react causing an etching process of the target material, see FIG. 2. In order to provide the activation energy and prevent spontaneous reaction in areas not exposed by the electron beam the laser wavelength and light intensity might need to be adjusted to selectively cause a reaction only in electron beam modified areas. The laser light can be applied during the whole process, or after the end of an electron beam exposure cycle.

One of the novel features of the procedure according to the invention is the timely coupling of the pulsed laser photon beam, which is switched on to stimulate chemical reactions of the adsorbed chemicals with the substrate surface before or after a electron beam induced reaction has taken place. This interlock requires a specialized trigger and laser pulse emission of the light to the sample.

In this "layer by layer etching" scheme the electron beam would be scanned or rastered across the area just long enough to cause a chemical modification of one or a few monolayers at the surface. A short laser pulse will then selectively desorb this modified layer for example thermally—this is known in the literature as laser induced thermal desorption—or photochemically by causing an electronic excitation of molecules, which are only present in the modified layer. The cycle of electron beam exposure and laser pulse is then repeated until the material is removed to the desired depth, see FIG. 3.

Possible events and actions used in the present invention are listed in table 1. In the following the concept of the present invention is illustrated using the etching of chromium, a commonly used absorber material on photolithographic masks, as an example. However, it should be understood that the described process including the nature and order of the described steps as well as the chemicals used are for illustration purposes only and does not limit the scope of the present invention to this particular process.

Before starting the etching process the chromium surface is cleaned by applying a short laser pulse to heat the surface. Alternatively or in combination with the laser pulse a suitable gas, for example water vapor and electron beam exposure can be used to clean the surface from organic contamination.

In the first step of the etching cycle the surface is exposed to a suitable precursor gas such as halogens, alone or in combination with oxygen or water vapor. If more than one gas is needed, for example $Cl_2$ and $O_2$, those gases can be delivered simultaneously or separately in a precisely controlled order and duration.

In the second step the area to be removed is exposed with an electron beam, which causes a reaction between the adsorbed precursor gas and the chromium substrate.

Alternatively, instead of delivering elemental halogens in step 1, a non-reactive gas such as a fluoro- or chlorocarbons might be used. Those compounds are known to decompose under electron beam exposure in a process known as dissociative electron attachment, whereby halogens are released. Since this process is selectively induced only by electrons one can achieve adsorption of released halogens on the target material only in areas that have been exposed by an electron beam.

In the third step the reaction product, for example nonvolatile chromiumoxychloride, is desorbed by heating the surface with a laser beam. For some etch chemistries the laser light might be applied during the whole process to locally raise the temperature above the desorption temperature of the reaction products. However, it is preferred to apply a short laser pulse at the end of an electron beam exposure cycle. In this "layer by layer etching" scheme the electron beam would be rastered across the area just long enough to cause a chemical modification of one or a few monolayers at the surface. A short laser pulse will then selectively desorb this modified layer for example thermally, this is know in the literature as laser induced thermal desorption, or photochemically, by causing an electronic excitation of molecules, which are only present in the modified layer. The cycle of precursor gas adsorption, electron beam exposure and laser pulse is then repeated until the material is removed to the desired depth.

The endpoint of the etching is determined chemically, if there is a chemical selectivity in etching the metal but not the quartz substrate. In this case the removal of material will stop once the quartz surface is reached. This endpoint can also be detected from the changing secondary electron or back scattered electron emission at the etched location. Alternatively, the desorbed monolayers material during the etch process can be monitored with a mass spectrometer in DC or a lock in method, since the desorption and evaporation takes place in well defined time intervals. The detection of the endpoint of the etching process can also be done evaluating spectroscopically the light emitted from the substrate and the chemical reaction products which is generated by electron and/or laser beam induced luminescence.

Table 1 shows schematic steps of the etching procedure

| Action | Beam | Result |
|---|---|---|
| Photon beam on to heat the sample | IR to Visible | Desorption of adsorbates Sample cleaning |
| Electron beam 100 eV to 200 keV | Areal scan to excite adsorption sites | Generation of adsorption sites for chemicals |
| Multi-Jet gas mixture on with 1 to 1000 Monolayers/sec | Gas or precursor mixture for stoichiometric composition of etch gas | Adsorption of reaction partners and instant reaction |
| Electron beam 100 eV to 200 keV | Activation of precursors and chemical etching reaction | Chemical etching to solid, liquid or gaseous compound |
| Photon beam UV to IR | Pulsed high power laser triggered with the electron beam | Evaporation of the chemical etch product |
| Repetition of the triggered action of the different beams | | Multilayer by multilayer ablation of the surface. |

In summary, the present invention is intended for the etching of materials where electron beam exposure alone is not sufficient to induce a full reaction sequence. In those cases it is assumed that in addition to one or more elementary reaction steps, which can be activated by electron beam exposure, there are one or more reaction steps, which do not proceed at a sufficient rate at room temperature. In this cases a beam of photons, preferably from a laser source, is used to provide the additional activation energy. The interaction between the photons and the material can be either photo-thermal, e.g. local heating of the substrate, or photo-chemical, e.g. the photon beam induces resonant electronic transitions to activate a intermediate reaction product.

To preserve the required spatial resolution provided by the focussed electron beam writing it is required that at least one step in the reaction sequence is activated by the electron beam. The effect of the electron beam exposure will be that the exposed area is in some chemically activated state, that when selectively induced by a laser beam those areas will further modified causing an etching process of the target material. In order to provide the activation energy and prevent spontaneous reaction in areas not exposed by the electron beam the laser wavelength and light intensity might need to be adjusted to selectively cause a reaction only in electron beam modified areas.

In the preferred embodiment of the invention the beam of electrons and the beam of photons exposure as well as the exposure to one or more beam of molecules can be either simultaneous or in a controlled sequence with defined exposure time and delays between different exposures, see FIG. 3. This flexibility allows to tailor the process to the specific needs of the material to be etched and the precursor chemicals. Some of the steps that might be involved in the etching process are listed in the above-mentioned table 1.

List of Reference Signs 10 mask repair system
12 molecular beam system/gas supply system
14 electron beam system
16 photon beam system/laser beam system
18 computer control system
20 reservoirs for liquid or solid precursors
22 feedings of gaseous precursors
24 feeding of pressurized air
26 valve control
28 pressure gauge
30 temperature control
32 CAN open bus
34 feedings
36 nozzles
38 manifold nozzle
40 end valve
42 electron beam unit
44 laser power supply
46 laser unit
48 mirror
50 laser beam
52 mask to be repaired
54 Faradays cage
56 secondary electron detector
58 environmental chamber
59 interferometer controlled motorized stage
60 multijet window
62 electron beam window
64 repair control window
66 microscope window
68 beam control computer
70 beam control
72 trigger
74 Laser interferometer stage control
76 Electron beam deflector coils and beam blanker

The invention claimed is:

1. Procedure for etching of materials at the surface by focussed electron beam induced chemical reactions at said surface, characterized in that in a vacuum atmosphere the material which is to be etched is irradiated with at least one beam of molecules, at least one beam of photons and at least one beam of electrons, whereby the irradiated material and the molecules of the beam of molecules are excited in a way that a chemical reaction predetermined by said material and said molecules' composition takes place and forms a reaction product and said reaction product is removed from the material surface.

2. Procedure according to claim 1, characterized in that said beam of photons is delivered by a laser source, said laser source is a pulsed laser system.

3. Procedure according to claim 1, characterized in that said beam of molecules is a beam of gas and said chemical reaction between said material to be etched and said gas of said beam of molecules includes at least one elemental chemical or physical reaction which is induced selectively by an electron beam exposure.

4. Procedure according to claim 1, characterized in that said reaction product is evaporated from the surface by said photon beam pulsed and focussed, which heats the material locally to a temperature above the vaporization temperature of said reaction product.

5. Procedure according to claim 1, characterized in that a laser delivers said beam of photons, said beam of photons is photo thermal to raise the surface temperature of the material to be etched locally and temporarily, and controlling said temperature of said material by selecting a laser intensity and wavelength.

6. Procedure according to claim 1, characterized in that a laser delivers said beam of photons and causes a photo chemical reaction, said laser is tuned to cause resonant electronic excitation in said material or within a chemical species generated by said previous electron beam exposure.

7. Procedure according to claim 1, characterized in that a cycle of exposures is repeated until a desired etch depth has been reached.

8. Procedure according to claim 1, characterized in that a defined dose of a beam of molecules selected from the group consisting of a halogen beam and an oxygen beam is delivered first, followed by an exposure of said beam of electrons, followed by a defined dose of a third beam which is selected from a group consisting of a halogen beam and an oxygen beam not used immediately prior to the application of the beam of electrons.

9. Procedure according to claim 1, characterized in that initially said surface of said material to be etched is cleaned.

10. Procedure according to claim 9, characterized in that said surface of said material is cleaned by a chemical reaction to remove contamination, oxides or other material on said surface of said material.

11. Procedure according to claim 9, characterized in that carbon contamination on said surface of said material is cleaned by a chemical reaction wherein a further reaction product is initiated by an additional beam of molecules comprising water, hydrogen peroxide, or chlorine or other halogen compounds which release excited halogen atoms to react with said carbon contamination on said surface.

12. Procedure according to claim 1, characterized in that said beam of molecules comprises different precursor gases.

13. Procedure according to claim 12, characterized in that a multi-jet gas delivery system is utilized and in that a gas feeding system is formed, said gas feeding system includes said multi-jet system with a flow rate from 0.1 to 10000 monolayers/sec.

14. Procedure according to claim 12, characterized in that a multi-jet gas delivery system is utilized and in that at least one of said precursor gases, necessary for removal of said reaction product is delivered by said multi-jet gas delivery system, said at least one of said precursor gases includes molecules which are not reactive spontaneously or when exposed to said beam of photons but can be activated by said beam of electrons.

15. Procedure according to claim 1, characterized in that in order to facilitate irradiation of said material and removal of said reaction product the beam of electrons is delivered with a scanning focussed electron beam system with a spot size of 0.1 to 1000 nm to generate a dense distribution of adsorption sites.

16. Procedure according to claim 15, characterized in that a gas feeding system is utilized and that said beam of molecules comprises selected chemical compounds in a stoichiometric composition issued from said gas feeding system to said surface of said material.

17. Procedure according to claim 16, characterized in that said beam of selected chemical compounds in a stoichiometric composition issued from said gas feeding system are excited by said beam of photons with a well specified energy and duration to induce a chemical reaction to produce said reaction product.

18. Procedure for etching of materials at the surface by focussed electron beam induced chemical reactions at said surface, characterized in that in a vacuum atmosphere the material which is to be etched is irradiated with at least one beam of molecules, at least one beam of photons, and at least one beam of electrons, said beam of molecules, said beam of photons and said beam of electrons are delivered simultaneously whereby said irradiated material and said molecules are excited in a way that a chemical reaction predetermined by said material and said molecules' composition takes place and forms a reaction product and said reaction product is removed from said material surface.

19. Procedure according to claim 18, characterized in that said beam of photons is delivered by a laser source, said laser source is a pulsed laser system.

* * * * *

UNITED STATES PATENT AND TRADEMARK OFFICE
CERTIFICATE OF CORRECTION

PATENT NO. : 7,537,708 B2  Page 1 of 1
APPLICATION NO. : 11/772755
DATED : May 26, 2009
INVENTOR(S) : Hans Wilfried Peter Koops and Klaus Edinger It is certified that error appears in the above-identified patent and that said Letters Patent is hereby corrected as shown below:

Title Page, after "(12):" delete "Peter Koops et al." and insert -- Koops et al. --.

Col. 4, line 12, after "an" delete "eximer" and insert -- excimer --.

Col. 4, line 32, after "water," delete "hydrogenperoxyde" and insert -- hydrogen peroxide --.

Col. 4, line 43, after "from" delete "0,1" and insert -- 0.1 --.

Col. 7, line 18, after "and" delete "WO 02/19575 A1" and insert -- WO 02/19375 A1 --.

Col. 8, line 47, after "is" delete "know" and insert -- known --.

Signed and Sealed this

Fourteenth Day of July, 2009

JOHN DOLL
*Acting Director of the United States Patent and Trademark Office*

UNITED STATES PATENT AND TRADEMARK OFFICE
CERTIFICATE OF CORRECTION

PATENT NO. : 7,537,708 B2  Page 1 of 1
APPLICATION NO. : 11/772755
DATED : May 26, 2009
INVENTOR(S) : Hans Wilfried Peter Koops et al.

It is certified that error appears in the above-identified patent and that said Letters Patent is hereby corrected as shown below:

Title Page item "(73):" delete "Assignee:  Nawotec GmbH, Rossdorf (DE)" and insert
-- Assignees:  NaWoTec GmbH, Rossdorf (DE); University of Maryland, Riverdale, MD (US) --

Signed and Sealed this

Sixteenth Day of March, 2010

David J. Kappos
*Director of the United States Patent and Trademark Office*